(12) United States Patent
Farnworth

(10) Patent No.: US 6,887,787 B2
(45) Date of Patent: May 3, 2005

(54) METHOD FOR FABRICATING SEMICONDUCTOR COMPONENTS WITH CONDUCTORS HAVING WIRE BONDABLE METALIZATION LAYERS

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/617,936

(22) Filed: Jul. 10, 2003

(65) Prior Publication Data
US 2004/0104473 A1 Jun. 3, 2004

Related U.S. Application Data

(62) Division of application No. 10/183,705, filed on Jun. 25, 2002, now Pat. No. 6,784,544.

(51) Int. Cl.[7] .............................................. H01L 21/44
(52) U.S. Cl. ...................................................... 438/653
(58) Field of Search .................. 438/98, 106, 612–614, 438/652, 653, 678; 257/678, 736, 748, 751, 753, 766, 781

(56) References Cited

U.S. PATENT DOCUMENTS

| 5,445,311 A | 8/1995 | Trask et al. |
| 5,567,981 A | 10/1996 | Bhansali et al. |
| 5,792,594 A | 8/1998 | Brown et al. |
| 5,910,644 A | 6/1999 | Goodman et al. |
| 6,064,112 A | 5/2000 | Iwaya et al. |
| 6,127,736 A | 10/2000 | Akram |
| 6,197,613 B1 * | 3/2001 | Kung et al. .................. 438/106 |
| 6,218,281 B1 | 4/2001 | Watanabe et al. |
| 6,232,147 B1 | 5/2001 | Matsuki et al. |
| 6,303,524 B1 | 10/2001 | Sharangpani et al. |
| 6,335,104 B1 | 1/2002 | Sambucetti et al. |
| 6,372,624 B1 | 4/2002 | Farnworth et al. |
| 6,380,555 B1 | 4/2002 | Hembree et al. |
| 6,388,333 B1 | 5/2002 | Taniguchi et al. |
| 6,396,148 B1 | 5/2002 | Eichelberger et al. |
| 6,403,457 B2 | 6/2002 | Tandy |
| 6,451,624 B1 | 9/2002 | Farnworth et al. |
| 6,455,408 B1 | 9/2002 | Hwang et al. |
| 6,501,165 B1 | 12/2002 | Farnworth et al. |
| 6,586,273 B2 * | 7/2003 | Aiba et al. ................... 438/106 |
| 6,620,633 B2 | 9/2003 | Hembree et al. |
| 6,620,731 B1 | 9/2003 | Farnworth et al. |
| 2001/0031548 A1 * | 10/2001 | Elenius et al. ............... 438/613 |

* cited by examiner

Primary Examiner—Carl Whitehead, Jr.
Assistant Examiner—Jennifer M. Dolan
(74) Attorney, Agent, or Firm—Stephen A. Gratton

(57) ABSTRACT

A semiconductor component includes a semiconductor die, a low k polymer layer on the die and redistribution conductors on the polymer layer. The component also includes bonding pads on the conductors with a metal stack construction that includes a conductive layer, a barrier/adhesion layer and a non-oxidizing layer. The bonding pads facilitate wire bonding to the component and the formation of reliable wire bonds on the component. A method for fabricating the component includes the steps of forming the conductors and bonding pads using electroless deposition. The component can be used to fabricate electronic assemblies such as modules, packages and printed circuit boards.

27 Claims, 6 Drawing Sheets

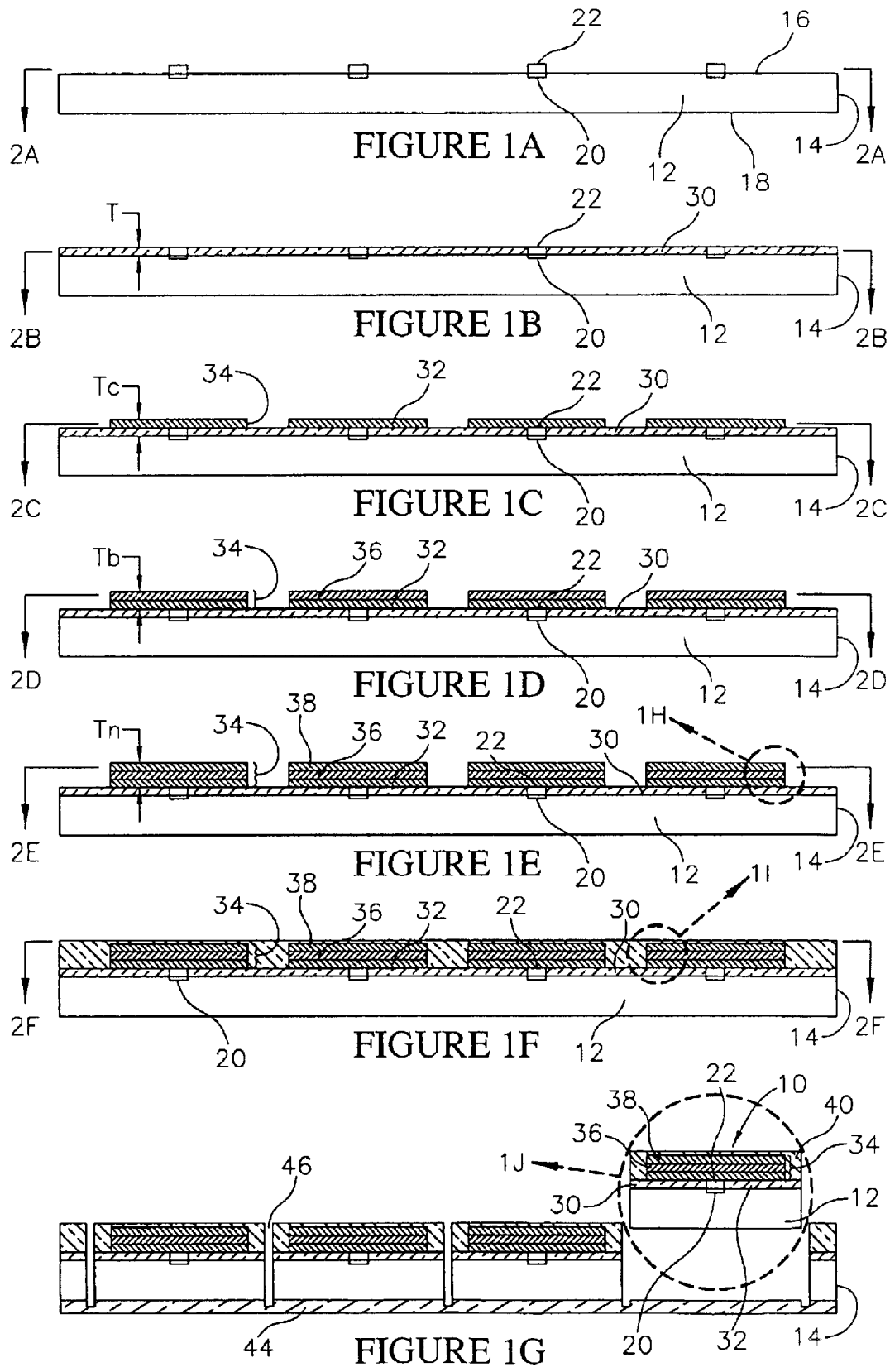

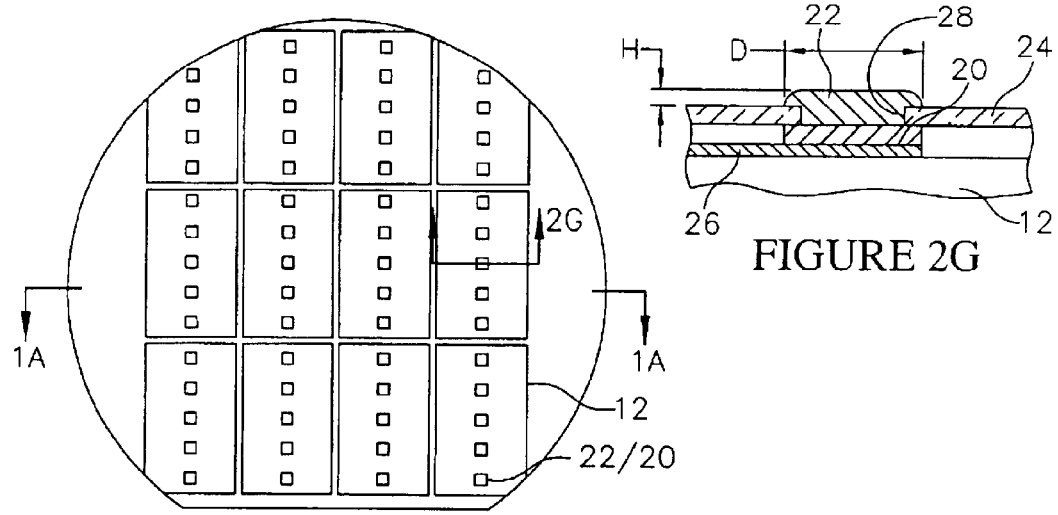
FIGURE 2A
FIGURE 2G
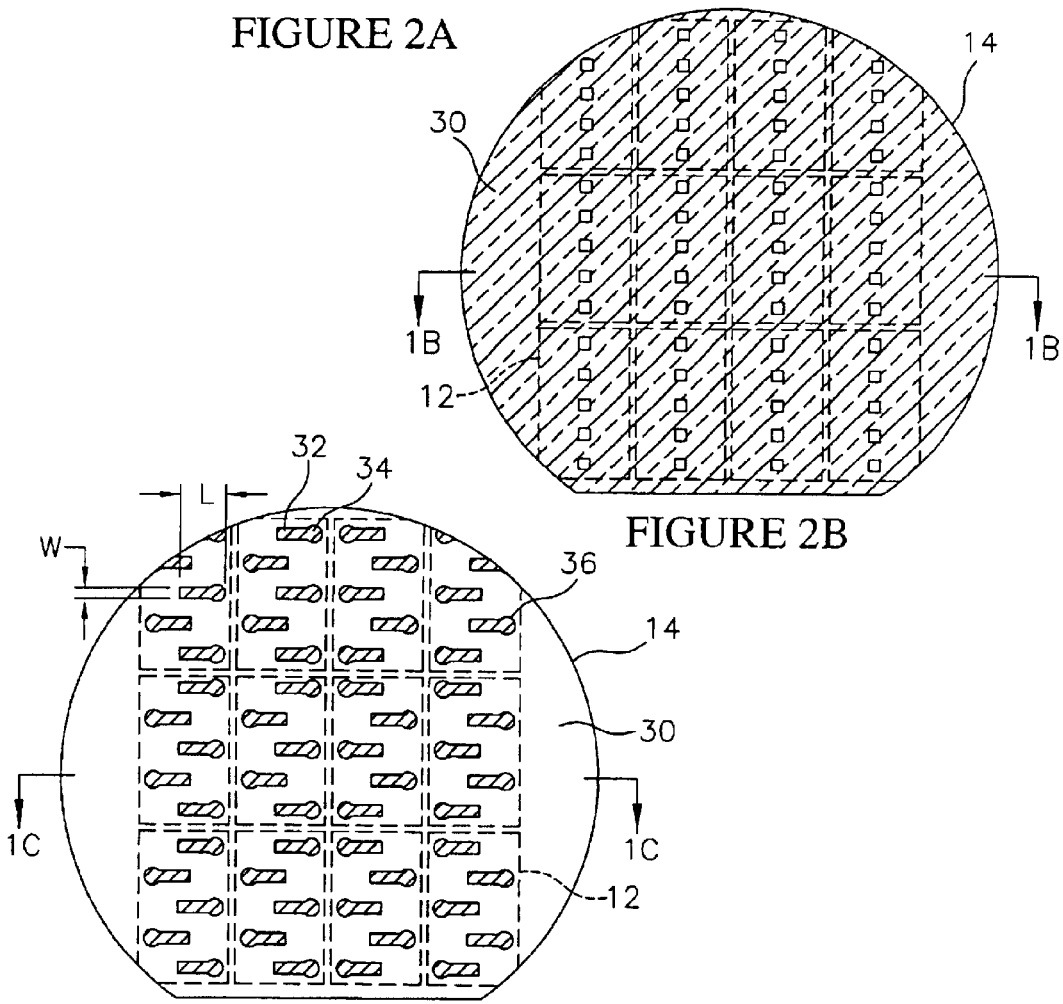
FIGURE 2B
FIGURE 2C

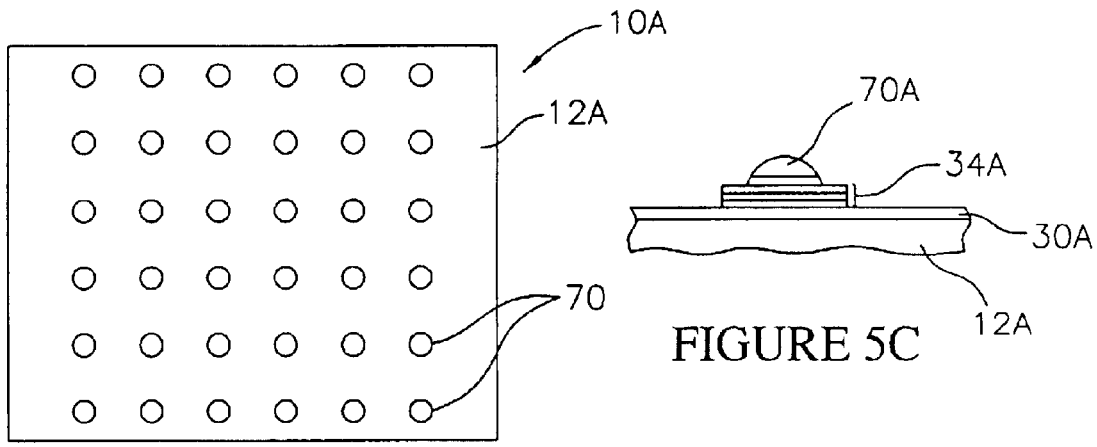
FIGURE 5A
FIGURE 5C
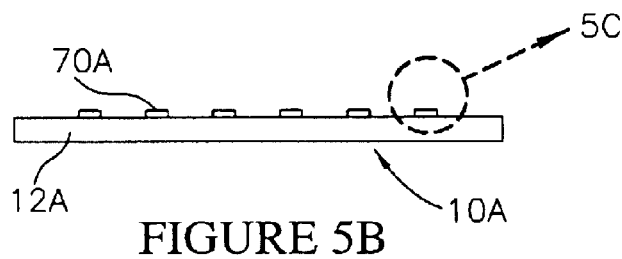
FIGURE 5B
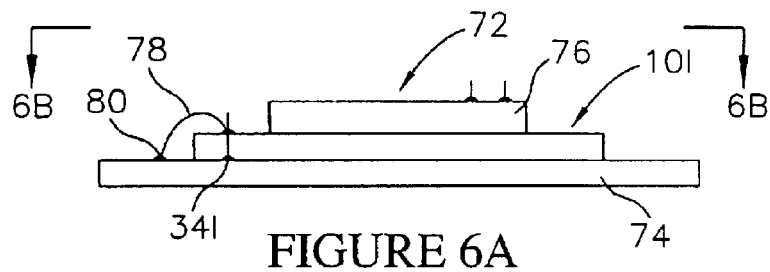
FIGURE 6A
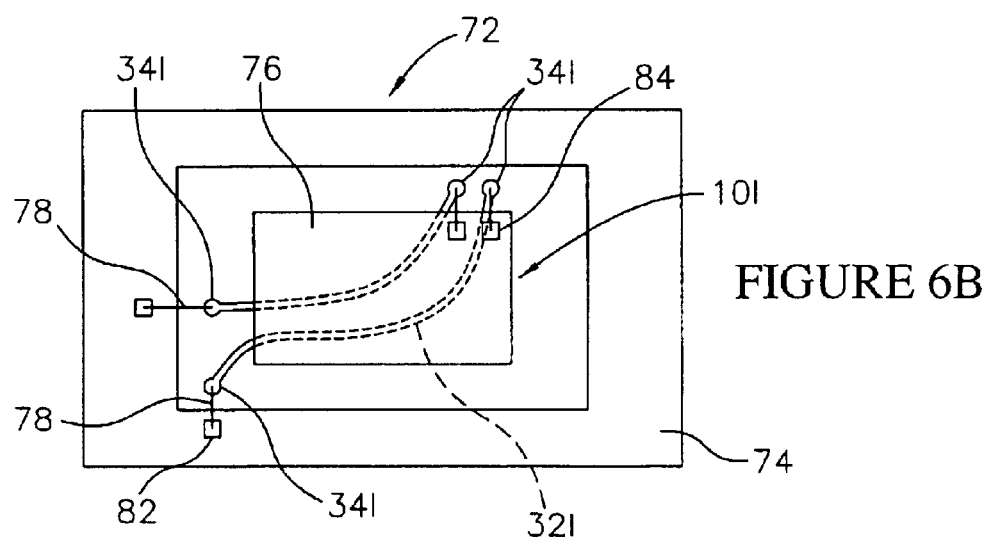
FIGURE 6B

METHOD FOR FABRICATING SEMICONDUCTOR COMPONENTS WITH CONDUCTORS HAVING WIRE BONDABLE METALIZATION LAYERS

CROSS REFERENCE TO RELATED APPLICATIONS

This application is a division of Ser. No. 10/183,705, filed Jun. 25, 2002, now U.S. Pat. No. 6,784,544.

FIELD OF THE INVENTION

This invention relates generally to semiconductor manufacture and packaging. More particularly, this invention relates to improved semiconductor components having conductors with wire bondable metallization layers, to methods for fabricating the components, and to electronic assemblies incorporating the components.

BACKGROUND OF THE INVENTION

Redistribution circuits are widely used in fabricating semiconductor components such as packages, dice, wafers, interconnects and interposers. Typically, redistribution circuits are used to provide specific electrical paths on a semiconductor component. For example, a semiconductor package can include a single die having bond pads in electrical communication with the integrated circuits contained on the die. Redistribution circuits can be formed on the circuit side of the die to provide electrical paths between the bond pads and terminal contacts for the package.

A typical redistribution circuit includes an insulating polymer layer on the die, and a pattern of redistribution conductors on the insulating layer. Typically, the insulating layer comprises a low dielectric constant polymer material, such as polyimide, benzocyclobutene (BCB) or polybenzoxazole (PBO). The redistribution conductors typically comprise a highly conductive metal such as Al or Cu.

One problem occurs if the redistribution conductors must be wire bonded to contacts on a mating component such as another package, a module substrate or a printed circuit board. Although the redistribution conductors can comprise a wire bondable metal, it is difficult to form reliable wire bonds to the redistribution conductors. In general, wire bonds are affected by the power, duration and force used to form the wire bonds. If insufficient power, duration or force is used, the wire bonds do not bond to the redistribution conductors (i.e., "no stick"). The inventor has theorized that this may be due to the resiliency and energy dissipating characteristics of the underlying polymer insulating layer. However, if too much power, duration or force is used to compensate for the affects of the polymer layer, the redistribution conductors and the polymer layer can be damaged (i.e., "cratering"). The process window for wire bonding to the redistribution conductors is thus very small or non-existent.

The present invention is directed to improved components having redistribution conductors with a wire bondable layer formed thereon. This invention also relates to methods for fabricating the components, and to systems incorporating the components.

SUMMARY OF THE INVENTION

In accordance with the present invention, an improved semiconductor component, a wafer level method for fabricating the component, and electronic assemblies incorporating the component, are provided.

The component includes a semiconductor die having die contacts, such as bond pads, in electrical communication with integrated circuits thereon. The component also includes a low k polymer layer on the circuit side of the die, and a pattern of conductors and bonding pads on the polymer layer in electrical communication with the die contacts. The conductors are configured to redistribute or fan out the die contacts to the pattern of the bonding pads. The conductors and the bonding pads comprise metal stacks including conductive layers, barrier/adhesion layers, and non-oxidizing layers. The barrier/adhesion layers and the non-oxidizing layers protect the conductors and the bonding pads, and allow wire bonding to the component without damage to the conductors or the bonding pads. In addition, the bonding pads can optionally include terminal contacts such as stud bumps configured for flip chip bonding, or alternately double bump wire bonding to the component.

The component can be used to fabricate any electronic assembly that requires wire bonding to a mating substrate such as a module substrate, a package substrate or a printed circuit board.

The method for fabricating the component includes the step of providing multiple dice on a common substrate such as a semiconductor wafer. The method also includes the steps of forming the polymer layer on the substrate, forming the conductors and the bonding pads on the polymer layer, and forming the barrier/adhesion layers and the non-oxidizing layers on the conductors and bonding pads. In the illustrative embodiment the conductors, the barrier/adhesion layers and the non-oxidizing layers are formed using electroless deposition. The method also includes a singulating step in which the components are singulated from the substrate.

An alternate embodiment component comprises an interposer configured to electrically connect semiconductor components to one another, or to supporting substrates.

BRIEF DESCRIPTION OF THE DRAWINGS

FIGS. 1A–1G are schematic cross sectional views illustrating steps in a method for fabricating a semiconductor component in accordance with the invention;

FIG. 2A is a cross sectional view taken along section line 2A—2A of FIG. 1A illustrating a wafer level substrate for fabricating multiple components;

FIG. 2B is a cross sectional view taken along section line 2B—2B of FIG. 1B illustrating a polymer layer on the components;

FIG. 2C is a cross sectional view taken along section line 2C—2C of FIG. 1C illustrating conductors on the components;

FIG. 2G is an enlarged cross sectional view taken along section line 2G—2G of FIG. 2A illustrating a component contact and a metal bump on the component contact;

FIG. 5A is a plan view of an alternate embodiment component having terminal contacts;

FIG. 5B is a side elevation view of the alternate embodiment component;

FIG. 5C is an enlarged view of a terminal contact on the alternate embodiment component;

FIG. 6A is a schematic side elevation view of a stacked assembly that includes an alternate embodiment interposer component constructed in accordance with the invention; and FIG. 6B is a plan view taken along line 6B—6B of FIG. 6A.

DETAILED DESCRIPTION OF THE PREFERRED EMBODIMENT

As used herein, the term "semiconductor component" refers to an electronic element that includes a semiconductor die. Exemplary semiconductor components include bare dice, such as bumped die and flip chip devices. Other exemplary semiconductor components include semiconductor packages, such as chip scale packages, BGA devices, BOC packages, COB packages, stacked packages and lead on chip (LOC) packages. Semiconductor component also refers to an electronic element, such as an interposer, configured to make electrical connections with a semiconductor die or a semiconductor package.

Referring to FIGS. 1A–1G, steps in the method for fabricating a semiconductor component 10 (FIG. 1G) in accordance with the invention are illustrated.

Figure 1H:
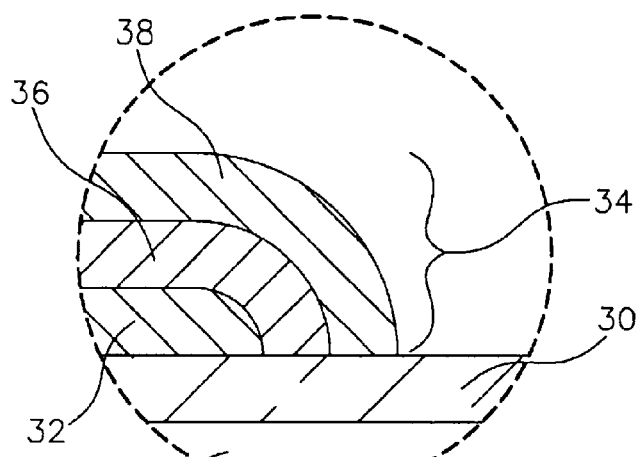
FIG. 1H is an enlarged view taken along line 1H of FIG. 1E.
Figure 2D:
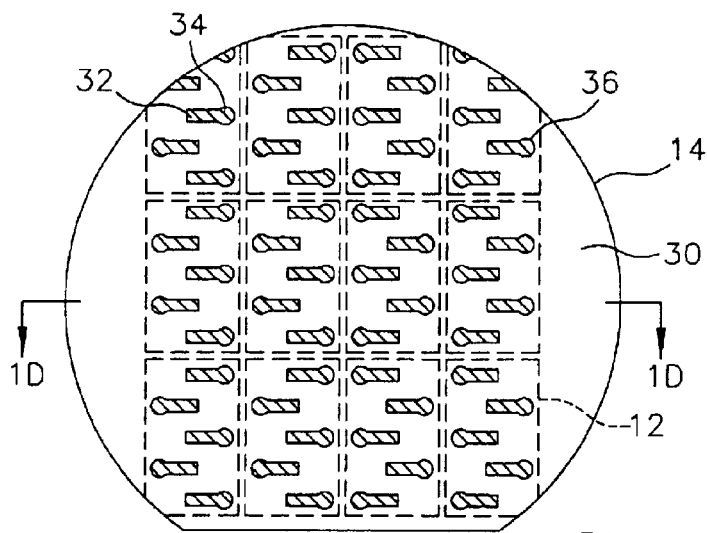
FIG. 2D is a cross sectional view taken along section line 2D—2D of FIG. 1D illustrating barrier layers on the conductors.

Initially, as shown in FIGS. 1A and 2A, a plurality of semiconductor dice 12 are provided on a semiconductor substrate 14. The dice 12 can comprise conventional semiconductor dice having a desired configuration, and the substrate 14 can comprise a semiconductor wafer or portion thereof. For example, each die 12 can comprise a dynamic random access memory (DRAM), a static random access memory (SRAM), a flash memory, a microprocessor, a digital signal processor (DSP) or an application specific integrated circuit (ASIC).

Each die 12 includes a circuit side 16 and a back side 18. Each die 12 also includes a pattern of die contacts 20 formed on the circuit side 16 thereof. In the illustrative embodiment, the die contacts 20 are the bond pads for the die 12. The die contacts 20 can be formed in any conventional pattern such as a center pattern, an edge pattern or a grid pattern. In addition, the die contacts 20 can comprise a conventional metal such as Al, Au, Cu, Ni or alloys of these metals.

As shown in FIG. 2G, the die contacts 20 are embedded in a die insulating layer 24, and are in electrical communication with integrated circuits 26 contained on the die 12. For simplicity, the die insulating layer 24 and the integrated circuits 26 are not shown in FIGS. 1A–1G. The die insulating layer 24 can comprise any electrically insulating material including glasses such as BPSG, polymers such as polyimide and resist, and oxides such as $SiO_2$. In addition, the die insulating layer 24 includes openings 28 aligned with the die contacts 20.

As also shown in FIGS. 1A and 2A, metal bumps 22 are formed on the die contacts 20. The metal bumps 22 can be formed on the die contacts 20 using a deposition process, such as electroless or electrolytic deposition. For example, the metal bumps 22 can comprise Ni deposited on the die contacts 20 using an electroless deposition process. With an electroless process the substrate 14 can be dipped in a zincate activation solution, such as $ZnO_2$ or $Zn(OH)_4$ to activate the surface of the die contacts 20. Following activation, the substrate 14 can be dipped in a nickel solution such as $NiCl_2$, at a temperature of about 85 to 90° C., for a time period sufficient to form the metal bumps 22. Zincate and nickel solutions are commercially available from Lea Ronal of Freeport, N.Y. One suitable nickel solution is commercially available under the trademark "PALLAMERSE Ni".

As shown in FIG. 2G, a diameter D of the metal bumps 22 is about equal to the width of the die contacts 20, with a range of from about 25 μm to 100 μm being representative. In addition, a height H of the metal bumps 22 can be selected as required, with from about 20 μm to 125 μm being representative.

Referring to FIGS. 1B and 2B, following forming of the metal bumps 22, a first polymer layer 30 is blanket deposited on the substrate 14. The first polymer layer 30 and the metal bumps 22 are then planarized such that the first polymer layer 30 and the metal bumps 22 have a same planar surface. The polymer layer 30 preferably comprises a low dielectric constant (low k) polymer such as polyimide, polybenzoxazole (PBO), or benzocyclobutene (BCB). As used herein, the term "low k" refers to a material with a dielectric constant of less than about 3.9.

In addition, the polymer layer 30 can be initially blanket deposited to a desired thickness using a suitable deposition process such as spin on, positive displacement through a nozzle, screen printing and stenciling. Systems are commercially available for performing each of these processes in the context of semiconductor packaging. For example, material dispensing systems are manufactured by Asymtek of Carlsbad, Calif., and by Camalot of Cookson, UK.

Following deposition, the polymer layer 30 can be cured. Depending on the polymer, curing can be performed by placing the substrate 14 in an oven at a required temperature (e.g., 90° to 165° C.) for a required time (e.g., 30 to 60 minutes). Following curing of the polymer layer 30, the polymer layer 30 and the bumps 22 can be planarized to a same planar surface. Following planarization, a representative thickness T of the polymer layer 30 and height H of the metal bumps 22 can be from 20 μm to 100 μm.

The planarization step can be performed using a mechanical planarization apparatus, such as a grinder. One suitable mechanical planarization apparatus is manufactured by Okamoto, and is designated a model no. VG502. The planarization step can also be performed using a chemical mechanical planarization (CMP) apparatus. A suitable CMP apparatus is commercially available from a manufacturer such as Westech, SEZ, Plasma Polishing Systems, or TRUSI. The planarization step can also be performed using an etch back process, such as a wet etch process, a dry etch process or a plasma etching process.

In addition to providing an end point for the polymer layer 30, the metal bumps 22 protect the die contacts 20 from corrosion, increase the surface areas of the die contacts 20, and improve the reliability of subsequent electrical connections with the die contacts 20. As another alternative, the metal bumps 22 can be omitted and the polymer layer 30 can comprise a photoimageable material, such as a low k resist. In this case, exposure and development of the polymer layer 30 forms openings aligned with the die contacts 20. In addition, a planarization step is not required. Next, as shown in FIGS. 1C and 2C, conductors 32 are formed on the first polymer layer 30 in electrical communication with the metal bumps 22 and the die contacts 20. As shown in FIG. 2C, the conductors 32 redistribute or "fan out" the pattern of the die contacts 20 from the centers to the edges of the dice 12 (i.e., redistributed from a first pattern to a second pattern). In addition, the conductors 32 include wire bonding pads 34, which in the illustrative embodiment are enlarged, generally planar segments with hemispherical edges located at the terminal ends of the conductors 32. The conductors 32 can be laid out such that the wire bonding pads 34 are configured in a desired pattern, such as a dense area array (e.g., grid array). As such, the wire bonding pads 34 have a pattern that is different that the pattern of the die contacts 20. In addition, the conductors 32 have a width W (FIG. 2C), a length L (FIG. 2C) and a thickness T (FIG. 1C). As will be further explained, these dimensions can be adjusted to achieve required electrical characteristics such as capacitance and resistivity.

The conductors 32 and the bonding pads 34 preferably comprise a highly conductive metal layer such as copper (Cu). In addition, the conductors 32 and the bonding pads 34 can be formed using the same process and materials, or alternately can be formed separately. For example, copper can be electrolessly plated on the polymer layer 30 in a required pattern and with desired dimensions using techniques that are known in the art. To perform the electroless plating, the polymer layer 30 can be initially cleaned and the substrate 14 dipped in an aqueous bath containing a catalyst configured to form a copper seed layer. Catalyst systems are commercially available from Lea Ronal of Freeport, N.Y. under the trademark "UMT CATALYST SYSTEM".

Following formation of the copper seed layer, a resist layer can be formed on the copper seed layer, and patterned to define the conductors 32 in electrical contact with the metal bumps 22 and the bonding pads 34 in the required pattern. Suitable resists, such as electro deposited resists, are available from Shipley Corporation of Newton, Mass. Next, the substrate 14 can be dipped in an electroless or an electrolytic copper plating solution, such that copper is applied to areas of the seed layer not covered by the resist. One suitable plating solution can include "RONADEP" manufactured by Lea Ronal and DI water. The copper can be electrolessly plated to form the conductors 32 and the bonding pads 34 with a thickness of from about 1 µm to 4 µm.

Following electroless copper plating, the resist can be stripped by plasma etching or other suitable process. In addition, the exposed copper seed layer can be removed by etching, such that just the conductors 32 and the bonding pads 34 remain in the required pattern.

The outlined process for forming the conductors 32 and the bonding pads 34 by electroless plating is merely exemplary, and other processes known in the art can be employed to form the conductors 32 and the bonding pads 34 of copper or other metals, such as Al, Cr, Ti, Ni, W, Au, Ag, Ta, Mb. Other suitable deposition processes include CVD, PECVD, PVD, sputtering and evaporation.

Referring to FIG. 1D, following formation of the conductors 32, a barrier/adhesion layer 36 can be formed on the conductors 32 and on the bonding pads 34. The barrier/adhesion layer 36 functions to provide a diffusion barrier for the conductors 32 and the bonding pads 34. The barrier/adhesion layer 36 also provides adhesion to the conductors 32 and the bonding pads 34 for a subsequently deposited non-oxidizing layer 38 (FIG. 1E). In addition, the barrier/adhesion layer 36 allows a thickness of the conductors 32 and the bonding pads 34 to be adjusted to achieve desired electrical characteristics. For example, the resistivity of the conductors 32 is a function of the width (W), the thickness (Tc), the length (L) and the material of the conductors 32. The thickness Tb of the barrier/adhesion layer 36 adds to the overall thickness of the conductors 32 such that the width (W) or the overall thickness can be varied to achieve a desired resistivity. Similarly, capacitance C is a function of the area of the conductors 32 and their distance d from other electrical elements. The distance d can be dependent on the thickness Tb of the barrier layer 36 such that the capacitance C can be adjusted.

In the illustrative embodiment, the barrier/adhesion layer 36 comprises electrolessly deposited nickel. Other suitable metals for the barrier/adhesion layer 36 include V, Cr, CrCu and Cu. A representative thickness for the barrier/adhesion layer 36 can be from 100 Å to 5 µm. The barrier/adhesion layer 36 can be electrolessly or electrolytically deposited on the conductors 32 by dipping the substrate 14 in an zincate activation solution, and then in a nickel containing solution substantially as previously described for bumps 22. Alternately the barrier/adhesion layer 36 can be formed by blanket deposition such as sputtering, followed by etching to define the pattern.

Figure 2E:
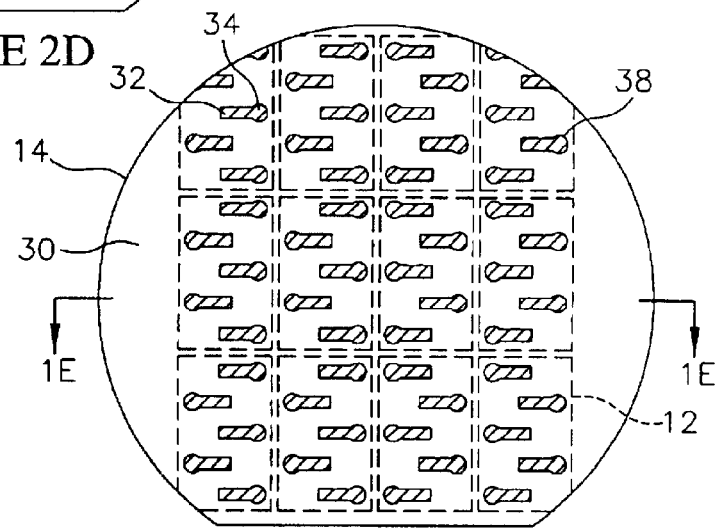
FIG. 2E is a cross sectional view taken along section line 2E—2E of FIG. 1E illustrating wire bonding layers on the conductors.

Referring to FIGS. 1E and 2E, following deposition of the barrier/adhesion layer 36, a non-oxidizing layer 38 can be deposited on the barrier/adhesion layer 36. The non-oxidizing layer 38 preferably comprises a noble metal such as gold (Au), platinum (Pt) or palladium (Pd).

In the illustrative embodiment the non-oxidizing layer 38 completely covers the conductors 32 and the bonding pads 34. Alternately, the non-oxidizing layer 38 can cover just the bonding pads 34. The non-oxidizing layer 38 seals and protects the conductors 32 and the bonding pads 34 from corrosion and oxidation. In addition, the non-oxidizing layer provides a wire bondable surface for wire bonding to the bonding pads 34. The non-oxidizing layer 38 can be deposited on the barrier/adhesion layer 36 using an electroless deposition process. For example, gold can be electrolessly deposited using a gold containing solution, such as gold potassium cyanide KAu(CN). A representative thickness Tn of the non-oxidizing layer 38 can be from 0.5 µm to 1.5 µm.

Figure 1I:
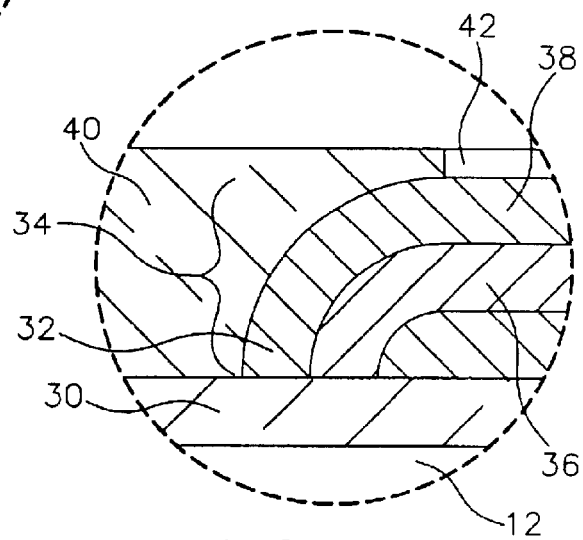
FIG. 1I is an enlarged view taken along line 1I of FIG. 1F.

As shown in FIG. 1H, each bonding pad 34 comprises a metal stack which includes a portion of a conductor 32 (i.e., a conductive layer), a portion of a barrier/adhesion layer 36, and a portion of a non-oxidizing layer 38. The metal stack can comprise three different metals (Cu/Ni/Au) or alternately two different metals (Cu/Cu/Ag). For simplicity, the metal stack is shown in FIGS. 1E-1G as having sharp continuous edges. However, with an electroless deposition process the barrier/adhesion layer 36 will coat the edges of the conductors 32, and the non-oxidizing layer 38 will coat the edges of the barrier/adhesion layer 36. Accordingly, the edges of the barrier/adhesion layer 36 and the edges of the non-oxidizing layer 38 will be rounded substantially as shown in FIGS. 1H and 1I. In addition, the bonding pads 34 will be completely sealed and protected from oxidation by the non-oxidizing layer 38.

Figure 2F:
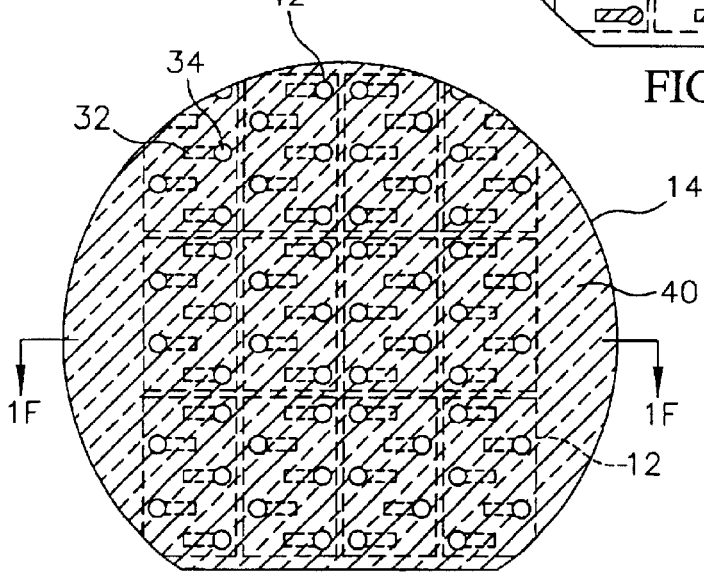
FIG. 2F is a cross sectional view taken along section line 2F—2F of FIG. 2F illustrating an outer polymer layer on the components.

Referring to FIGS. 1F and 2F, a second polymer layer 40 can be optionally deposited on the conductors 32 while leaving the bonding pads 34 exposed. For example, the second polymer layer 40 can comprise a low k photoimageable polymer deposited to a desired thickness, then patterned and developed to form openings 42 (FIG. 1I) aligned with the bonding pads 34.

Referring to FIG. 1G, a singulating step is performed to separate the individual components 10 from the substrate 14. The singulating step can be performed by attaching the substrate 14 to a dicing tape 44 and then sawing grooves 46 through the substrate 14. Alternately, the singulating step can be performed by shearing, etching or liquid jet cutting the substrate 14. Either prior or subsequent to the singulating step additional processes can be performed, such as encapsulating one or more surfaces of the component 10.

Figure 1J:
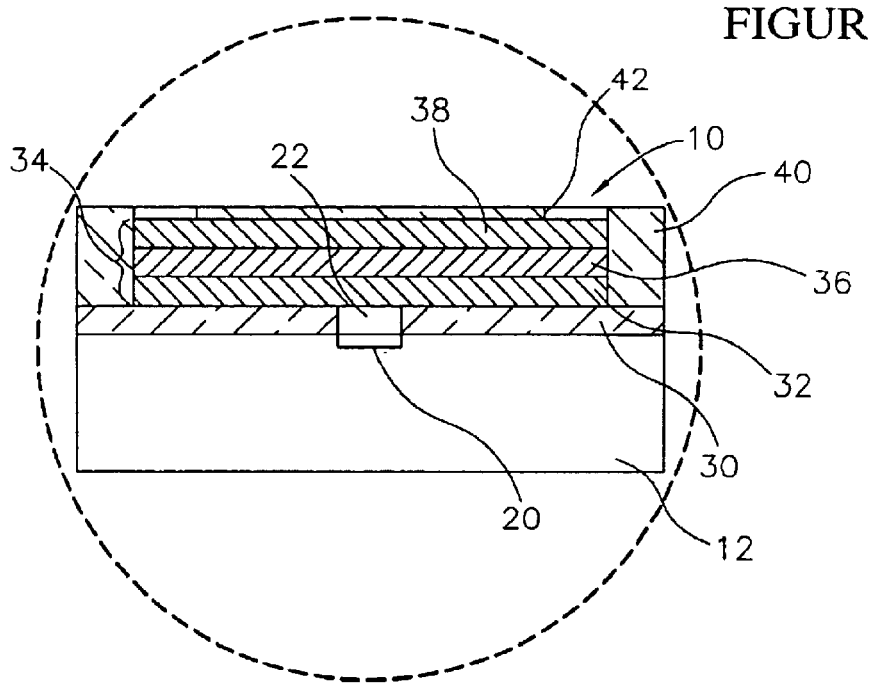
FIG. 1J is an enlarged view taken along line 1J of FIG. 1G illustrating the component.

As shown in FIG. 1J, a singulated component 10 includes a semiconductor die 12 having die contacts 20 in electrical communication with the integrated circuits 26 (FIG. 2G) thereon. The component 10 also includes metal bumps 22 on the die contacts 20 and a first polymer layer 30 on the die 12. The component 10 also includes a pattern of conductors 32 on the first polymer layer 30 in electrical communication with the metal bumps 22. The conductors 32 redistribute or fan out the electrical paths to the die contacts 20. The component 10 also includes bonding pads 34 with barrier/adhesion layers 36 and non-oxidizing layers 38. As will be further explained, the bonding pads 34 facilitate wire bonding to the component 10. The component 10 can also include a second polymer layer 40 on the non-oxidizing layers 38 having openings 42 aligned with the bonding pads 34.

Figure 3A:
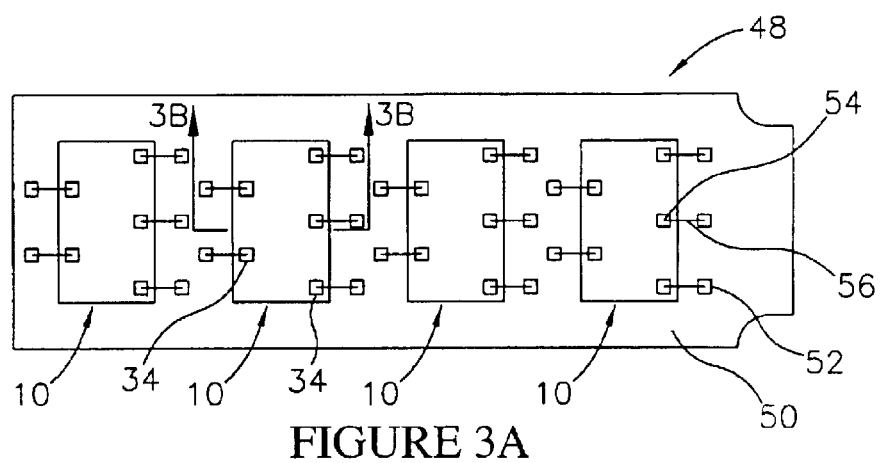
FIG. 3A is a schematic plan view of a module assembly that includes components fabricated in accordance with the invention.
Figure 3B:
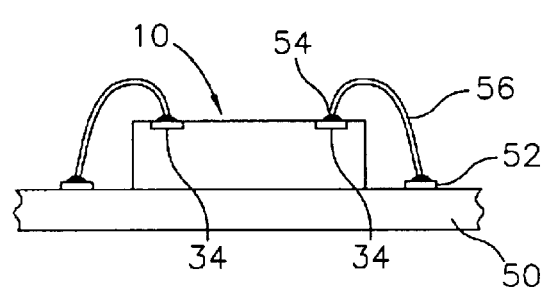
FIG. 3B is a cross sectional view taken along section line 3B—3B of FIG. 3A illustrating wire bonds on the module assembly.

Referring to FIGS. 3A and 3B, an electronic assembly 48 constructed using multiple components 10 is illustrated. The electronic assembly can comprise a multi chip module, a printed circuit board, a second level package or a similar assembly configured to perform a desired electrical function. The electronic assembly 48 includes a supporting substrate 50 having a pattern of electrodes 52 thereon. The electrodes electrically connect the components 10 to one another or to other electrical elements (not shown) of the assembly 48 or the outside world. The supporting substrate 50 can comprise a module substrate, a package substrate, a printed circuit board or other electronic element configured to support and electrically engage the components 10. The components 10 are back bonded to the supporting substrate 50 and wires 56 are bonded to the bonding pads 34 on the components 10 and to the electrodes 52 on the supporting substrate 50. In addition, wire bonds 54 are formed between the wires 56 and the bonding pads 34. These wire bonds 54 have increased reliability due to the multiple metal layer construction of the bonding pads 34. In addition, a process window for making the wire bonds 54 is increased and damage to the conductors 32 is decreased.

Figure 4A:
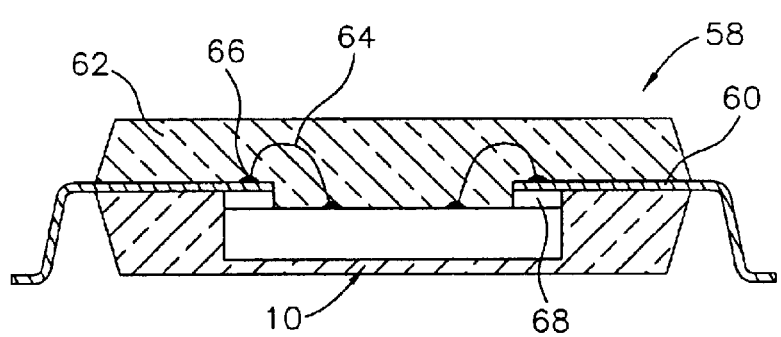
FIG. 4A is a schematic cross sectional view of a package assembly that includes a component fabricated in accordance with the invention.
Figure 4B:
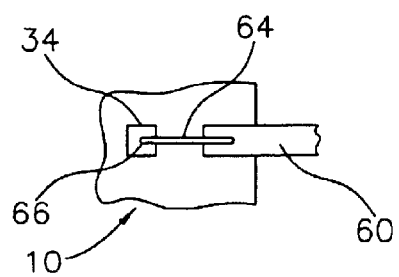
FIG. 4B is a cross sectional view taken along section line 4B—4B of FIG. 4A illustrating wire bonds on the package assembly.

Referring to FIGS. 4A and 4B, a package assembly 58 constructed using a component 10 is illustrated. The assembly 58 includes a plastic body 62 and a pattern of lead fingers 60 which form terminal leads for mounting and electrically engaging the assembly. The component 10 is attached to the lead fingers 60 in a lead on chip configuration using adhesive members 68, and is encapsulated in the plastic body 62. In addition, wires 64 are wire bonded to the lead fingers 60 and to the bonding pads 34 on the component 10. Further, wire bonds 66 are formed between the wires 64 and the bonding pads 34 on the component 10. The wire bonds 66 provide an increased reliability, a larger process window and prevent damage to the component 10 substantially as previously described.

Referring to FIGS. 5A and 5B, an alternate embodiment component 10A constructed in accordance with the invention is illustrated. The component 10A is substantially similar to the previously described component 10, and includes a polymer layer 30A and bonding pads 34A in electrical communication with conductors (not shown). The bonding pads 34A are constructed as a metal stack substantially as previously described, but are not encapsulated in a second polymer layer (e.g., 40-FIG. 1J). The component 10A also includes terminal contacts 70A formed on the bonding pads 34A which are arranged in a ball grid array (BGA). In this case the terminal contacts 70A are in the form of stud bumps fabricated using a wire bonder, ball bonder or similar apparatus. Preferably the terminal contacts 70A are formed while the component 10A is still on the substrate 14 (e.g., at FIG. 1E of the previously described method).

The terminal contacts 70A can comprise a metal such as Cu, Al or Au. In addition, the terminal contacts 70A can be used to flip chip bond the component 10A to a mating component such as a module substrate, package substrate or printed circuit board. The terminal contacts 70A can also be configured in other patterns, and used to wire bond the component 10A to a supporting substrate substantially as previously described. However, in this case double bonds are formed by the terminal contacts 70A and the wire bonds to the terminal contacts 70A.

Referring to FIGS. 6A and 6B, a stacked electronic assembly 72 fabricated using an alternate embodiment interposer component 10I is illustrated. The interposer component 10I includes conductors 32I and bonding pads 34I constructed as a metal stack substantially as previously described for conductors 32 and bonding pads 34. However, the interposer component 10I does not include integrated circuits in electrical communication with the bonding pads 34I. Rather, the interposer component 10I can be fabricated from a blank semiconductor wafer, or alternately from a non-conductive material such as ceramic or plastic. In addition, the bonding pads 34I are configured to interconnect a lower die 74 (or substrate) and an upper die 76, in a stacked wedding cake configuration. As such, the footprint of each element decreases as the top of the stack is approached. In the illustrative embodiment, the interposer component 10I is stacked and attached to the lower die 74, and wires 78 are wire bonded to wire bonding pads 34I on the interposer component 10I and to bonding pads 82 on the lower die 74. In addition, the upper die 76 is stacked and attached to the interposer 10I and wires 78 are wire bonded to bonding pads 84 on the upper die 76 and to the bonding pads 34I on the interposer component 10I.

Thus the invention provides improved semiconductor components, a wafer level method for fabricating the components, and electronic assemblies incorporating the components. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:
   providing a semiconductor die comprising a die contact and at least one integrated circuit in electrical communication with the die contact;
   forming a polymer layer on the die;
   forming a redistribution conductor on the polymer layer in electrical communication with the die contact;
   forming a wire bonding pad on the conductor;
   forming a first metal layer on the conductor and the wire bonding pad; and forming a non-oxidizing metal layer on the first metal layer covering the first metal layer and edges thereof configured to seal and protect the conductor and the wire bonding pad and to provide a wire bondable surface.

2. The method of claim 1 wherein the non-oxidizing metal layer comprises a metal selected from the group consisting of Au, Pt and Pd.

3. The method of claim 1 wherein the first metal layer comprises a metal selected from the group consisting of Ni, V, Cr, CrCu and Cu.

4. The method of claim 1 wherein the forming the first metal layer step and the forming the non-oxidizing metal layer step comprise electroless deposition.

5. The method of claim 1 further comprising forming a stud bump on the wire bonding pad.

6. The method of claim 1 further comprising wire bonding a wire to the wire bonding pad.

7. The method of claim 1 further comprising forming a second polymer layer on the die and the conductor having an opening aligned with the wire bonding pad.

8. A method for fabricating a semiconductor component comprising:

providing a die comprising a plurality of integrated circuits, a circuit side, and a plurality of die contacts on the circuit side in electrical communication with the integrated circuits having a first pattern;

forming a polymer layer on the circuit side;

forming a plurality of conductors on the polymer layer in electrical communication with the die contacts;

forming a plurality of wire bonding pads on the polymer layer in electrical communication with the conductors and having a second pattern;

forming a plurality of barrier/adhesion layers on the conductors and the wire bonding pads; and forming a plurality of non-oxidizing layers on the barrier/adhesion layers and edges thereof configured to seal and protect the conductors and the wire bonding pads and to provide wire bondable surfaces.

9. The method of claim 8 wherein the forming the conductors step and the forming the wire bonding pads step comprise electrolessly depositing a first metal.

10. The method of claim 8 wherein the forming the barrier/adhesion layers step comprises electrolessly depositing a second metal.

11. The method of claim 8 wherein the forming the non-oxidizing layers step comprises electrolessly depositing a third metal.

12. The method of claim 8 wherein the polymer layer comprises a material selected from the group consisting of polyimide, PBO and BCB.

13. The method of claim 8 wherein the barrier/adhesion layers comprises a metal selected from the group consisting of V, Cr, CrCu and Cu.

14. A method for fabricating a semiconductor component comprising:

providing a substrate comprising a semiconductor die comprising a plurality of integrated circuits and a plurality of die contacts in electrical communication with the integrated circuits;

forming a plurality of metal bumps on the die contacts;

forming a polymer layer on the die;

planarizing the polymer layer and the metal bumps to a same surface;

forming a plurality of conductors on the polymer layer in electrical communication with the metal bumps, the conductors comprising a plurality of wire bonding pads having a different pattern than the die contacts;

forming barrier/adhesion layers on the conductors and the wire bonding pads;

forming non-oxidizing layers on the barrier/adhesion layers and edges thereof configured to seal the conductors and the wire bonding pads and to provide wire bondable surfaces; and singulating the die from the substrate.

15. The method of claim 14 further comprising forming a plurality of stud bumps on the wire bonding pads.

16. The method of claim 14 further comprising forming a plurality of wire bonds on the wire bonding pads.

17. The method of claim 14 further comprising forming a second polymer layer on the die having openings aligned with the wire bonding pads.

18. The method of claim 14 wherein the substrate comprises a semiconductor wafer.

19. The method of claim 14 wherein the forming the barrier/adhesion layer step comprises electrolessly depositing Ni.

20. The method of claim 14 wherein the forming the non-oxidizing layer step comprises electrolessly depositing Au.

21. A method for fabricating a semiconductor component comprising:

providing a semiconductor die including a circuit side, a plurality of integrated circuits, and a plurality of die contacts on the circuit side in electrical communication with the integrated circuits having a first pattern;

forming a polymer layer on the circuit side;

forming a plurality of conductors on the polymer layer in electrical communication with the die contacts;

forming a plurality of wire bonding pads on the conductors having a second pattern;

forming a plurality of barrier/adhesion layers on the conductors and the wire bonding pads; and forming a plurality of non-oxidizing layers covering the barrier/adhesion layers and edges thereof configured to provide wire bondable surfaces.

22. The method of claim 21 further comprising adjusting electrical characteristics of the conductors by controlling a thickness of the barrier/adhesion layers.

23. The method of claim 21 further comprising forming a second polymer layer on the circuit side encapsulating the conductors and having a plurality of openings aligned with the wire bonding pads.

24. The method of claim 21 wherein the non-oxidizing layers completely seal the conductors and the wire bonding pads.

25. The method of claim 21 further comprising forming a plurality of stud bumps on the wire bonding pads.

26. The method of claim 25 further comprising wire bonding to the stud bumps.

27. The method of claim 21 further comprising wire bonding to the wire bonding pads.

* * * * *